(12) United States Patent
Katakura

(10) Patent No.: US 8,338,864 B2
(45) Date of Patent: Dec. 25, 2012

(54) SEMICONDUCTOR DEVICE

(75) Inventor: Hiroshi Katakura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 143 days.

(21) Appl. No.: 12/794,966

(22) Filed: Jun. 7, 2010

(65) Prior Publication Data

US 2010/0244142 A1   Sep. 30, 2010

Related U.S. Application Data

(63) Continuation of application No. PCT/JP2007/074091, filed on Dec. 14, 2007.

(51) Int. Cl.
*H01L 27/10* (2006.01)

(52) U.S. Cl. ........ 257/202; 257/203; 257/204; 257/206; 257/207

(58) Field of Classification Search .......... 257/202–204, 257/206, 207
See application file for complete search history.

(56) References Cited

U.S. PATENT DOCUMENTS

| | | | |
|---|---|---|---|
| 5,847,429 A | 12/1998 | Lien et al. | |
| 6,441,469 B1 | 8/2002 | Chrysostomides et al. | |
| 6,920,079 B2 | 7/2005 | Shibayama | |
| 7,259,393 B2 | 8/2007 | Chung et al. | |
| 7,538,368 B2 | 5/2009 | Yano | |
| 7,582,494 B2 | 9/2009 | Chung et al. | |
| 2004/0222442 A1* | 11/2004 | Komaki | 257/202 |
| 2005/0205894 A1* | 9/2005 | Sumikawa et al. | 257/202 |
| 2005/0280031 A1 | 12/2005 | Yano | |
| 2007/0007617 A1 | 1/2007 | Nakamura et al. | |
| 2007/0020858 A1 | 1/2007 | Yang et al. | |
| 2007/0026628 A1 | 2/2007 | Chung et al. | |
| 2007/0267680 A1 | 11/2007 | Uchino et al. | |
| 2007/0281398 A1 | 12/2007 | Chung et al. | |

FOREIGN PATENT DOCUMENTS

| | | |
|---|---|---|
| JP | 2005-64141 | 3/2005 |
| JP | 2006-5103 | 1/2006 |
| JP | 2006-210453 | 8/2006 |
| JP | 2007-27272 | 2/2007 |
| JP | 2007-36194 | 2/2007 |
| JP | 2007-43082 | 2/2007 |
| JP | 2007-311491 | 11/2007 |

OTHER PUBLICATIONS

Form PCT/ISA/210, mailed Mar. 18, 2008, in corresponding PCT Application No. PCT/JP2007/074091 (2 pp.).
Form PCT/ISA/220, mailed Mar. 18, 2008, in corresponding PCT Application No. PCT/JP2007/074091 (4 pp.).
Form PCT/ISA/237, mailed Mar. 18, 2008, in corresponding PCT Application No. PCT/JP2007/074091 (4 pp.).
Written Opinion, mailed Mar. 18, 2008, in corresponding International Application PCT/JP2007/074091 (5 pp.).
Extended European Search Report dated Jul. 27, 2012 in corresponding European Patent Application No. 07859821.6.

* cited by examiner

*Primary Examiner* — Samuel Gebremariam
(74) *Attorney, Agent, or Firm* — Staas & Halsey LLP

(57) ABSTRACT

A semiconductor device in a continuous diffusion region formed on a semiconductor substrate and having either a P-type or N-type polarity includes: a first transistor formed within the continuous diffusion region; a second transistor formed within the continuous diffusion region and in an area that is different from an area where the first transistor is formed; a third transistor formed within the continuous diffusion region and in an area between the first and second transistors, and having a gate electrode to which a fixed potential is applied; and a fourth transistor formed within the continuous diffusion region and in an area between the second and third transistors, and having a gate electrode to which a fixed potential is applied.

11 Claims, 13 Drawing Sheets

SEMICONDUCTOR DEVICE

CROSS-REFERENCE TO RELATED APPLICATIONS

This application is a continuation application, filed under 35 U.S.C. §111(a), of PCT Application No. PCT/JP2007/074091, filed on Dec. 14, 2007, the disclosure of which is herein incorporated in its entirety by reference.

FIELD

The present invention relates to a semiconductor device formed on a semiconductor substrate.

BACKGROUND

In post-65 nm generation microscopic technology for a large-scale integrated circuit designed by a gate array method or a standard cell method used in an information processing device, there is known a technique for increasing the mobility of electron and holes by using a dual-stress called strained silicon in the drain-source portion. Further, in the case where a plurality of circuits are arranged close to one another, an STI (Shallow Trench Isolation) is used for device isolation, in which a trench is formed in a silicon surface by anisotropic etching, and the trench is buried with an insulating film such as an oxide film, followed by flattening.

As a prior art relating to the present invention, there is known a CMOS (Complementary Metal Oxide Semiconductor) in which a shield gate is provided between NMOS (Negative channel Metal Oxide Semiconductor) transistors and an active region provided for each PMOS (Positive channel Metal Oxide Semiconductor) transistor (refer to, e.g., Patent Document 1).

[Patent Document 1] Japanese Laid-Open Patent Publication No. 2006-210453

PROBLEMS TO BE SOLVED BY THE INVENTION

There is a case where, when a plurality of circuits are arranged close to one another in a continuous diffusion layer, the performance of a transistor deteriorates due to constraint on the shape thereof or device isolation, or the transistor is subject to noise.

SUMMARY

According to an aspect of the invention, a semiconductor device in a continuous diffusion region formed on a semiconductor substrate and having either a P-type or N-type polarity is provided, the device includes: a first transistor formed within the continuous diffusion region; a second transistor formed within the continuous diffusion region and in an area that is different from an area where the first transistor is formed; a third transistor formed within the continuous diffusion region and in an area between the first and second transistors, and having a gate electrode to which a fixed potential is applied; and a fourth transistor formed within the continuous diffusion region and in an area between the second and third transistors, and having a gate electrode to which a fixed potential is applied.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First, a first circuit exemplified as a circuit for explaining an embodiment of the present invention will be described. The first circuit includes a 2-NAND (2-input negative logical multiplication) circuit and an INV (Inverter: negative) circuit.

Figure 1:
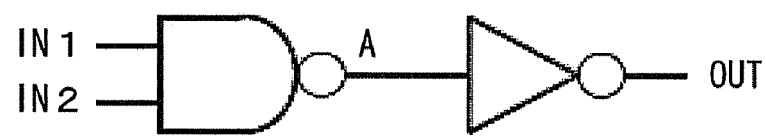
FIG. 1 is a circuit diagram illustrating the outline of a configuration of a first circuit.
Figure 2:
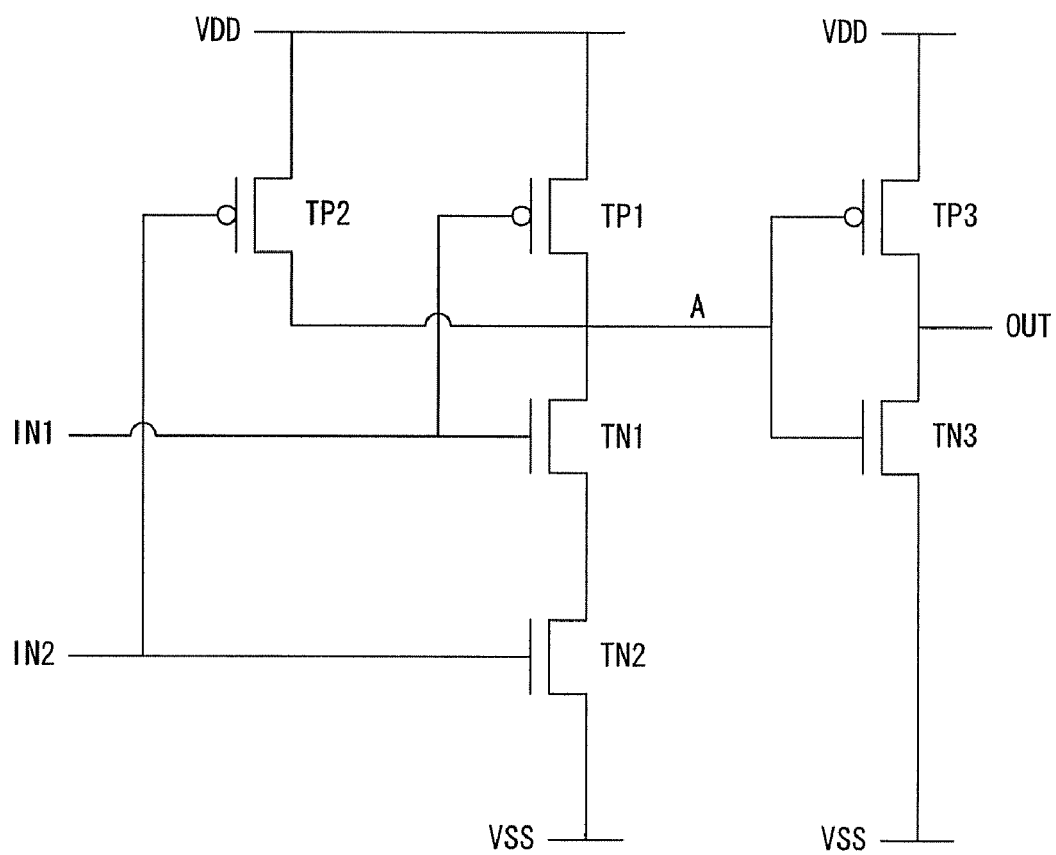
FIG. 2 is a circuit diagram illustrating the details of the configuration of the first circuit.

FIG. 1 is a circuit diagram illustrating the outline of a configuration of the first circuit. The 2-NAND circuit receives as inputs IN1 and IN2 and outputs A. The INV circuit receives as an input A and outputs OUT. FIG. 2 is a circuit diagram illustrating the details of the configuration of the first circuit. The 2-NAND circuit is constituted by PMOS transistors TP1, TP2 and NMOS transistors TN1, TN2. The INV circuit is constituted by a PMOS transistor TP3 and a NMOS transistor TN3.

Next, Comparative Examples 1 and 2 exemplified as layout examples of the first circuit will be described.

Comparative Example 1

Figure 3:
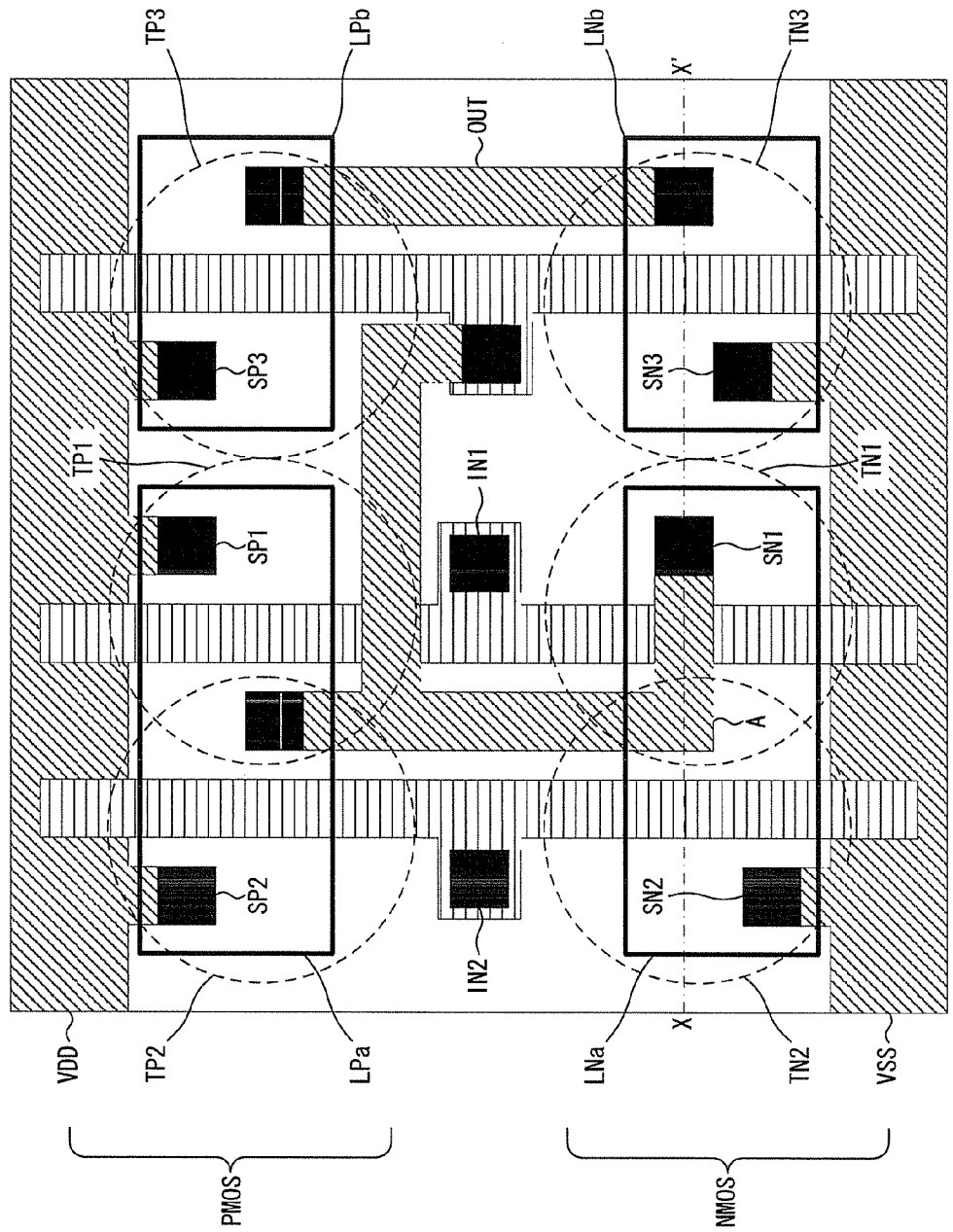
FIG. 3 is a plan view illustrating a layout example of a first circuit according to Comparative Example 1.

Comparative Example 1 is a case where an STI is used for device isolation. FIG. 3 is a plan view illustrating a layout example of the first circuit according to Comparative Example 1. In FIG. 3, the same reference marks as those in FIG. 2 denote the same or corresponding parts as those in FIG. 2, and the descriptions thereof will be omitted here. Hereinafter, in the plan view of the layout, a region surrounded by a bold line denotes a diffusion layer. A diffusion layer LPa constitutes the diffusion layer of the PMOS transistors TP1 and TP2, and a diffusion layer LNa constitutes the diffusion layer of the NMOS transistors TN1 and TN2. Further, a diffusion layer LPb constitutes the diffusion layer of the PMOS transistor TP3, and a diffusion layer LNb constitutes the diffusion layer of the NMOS transistor TN3. Hereinafter, in the layout view, a region shaded by diagonal lines denotes a metal, a region shaded by horizontal lines denotes a gate polysilicon which is a gate electrode formed by polycrystalline silicon, and a blackened region denotes a contact serving as a contact point for upper layer wiring.

A power supply wiring VDD (high potential) is disposed at the uppermost portion in FIG. 3, and a power supply wiring VSS (low potential) is disposed at the lowermost portion. The PMOS transistors are arranged on the VDD side, and the NMOS transistors are arranged on the VSS side. As the PMOS transistors, the PMOS transistors TP2, TP1, and TP3 are arranged in this order from the left. As the NMOS transistors, the NMOS transistors TN2, TN1, and TN3 are arranged in this order from the left.

IN1 is a gate electrode of the transistors TP1 and TN1, and IN2 is a gate electrode of the transistors TP2 and TN2. A (SN1) is a drain electrode of the transistors TP1, TN1, and TP2 and a gate electrode of the transistors TP3 and TN3. OUT is a drain electrode of the transistors TP3 and TN3. SP2 is a source electrode of the transistor TP2, SP1 is a source electrode of the transistor TP1, and SN2 is a source electrode of the transistor TN2. SP3 is a source electrode of the transistor TP3, and SN3 is a source electrode of the transistor TN3.

Figure 4:
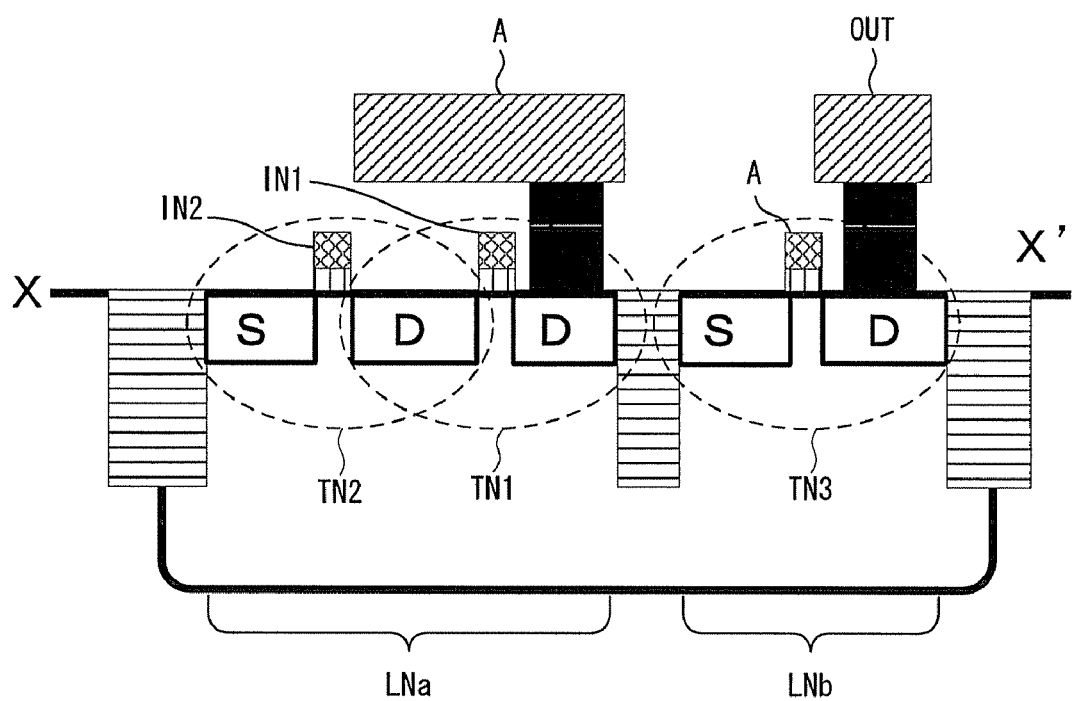
FIG. 4 is a cross-sectional view illustrating a layout example of the first circuit according to Comparative Example 1.

FIG. 4 is a cross-sectional view illustrating a layout example of the first circuit according to Comparative Example 1. In FIG. 4, the same reference marks as those in FIG. 3 denote the same or corresponding parts as those in FIG. 3, and the descriptions thereof will be omitted here. FIG. 4 is a cross-sectional view taken along X-X' line of FIG. 3.

STIs are provided on the left side of the transistors TP2 and TN2, on the right side of the transistors TP3 and TN3, and between the transistors TP1, TN1 and transistors TP3, TN3, respectively. As diffusion layers, a diffusion layer LPa of the transistors TP1 and TP2, a diffusion layer LNa of the transistors TN1 and TN2, a diffusion layer LPb of the transistor TP3, and a diffusion layer LNb of the transistor TN3 are provided. That is, the diffusion layer of the 2-NAND circuit and diffusion layer of the INV circuit are isolated from each other by the STI.

According to Comparative Example 1, the diffusion layers of the 2-NAND circuit and INV circuit are isolated from each other by the STI and, correspondingly, the size of the diffusion layers is reduced, so that the effect of a strained silicon is small. Further, the transistor performance deteriorates due to a compression stress from the STI.

Comparative Example 2

Figure 5:
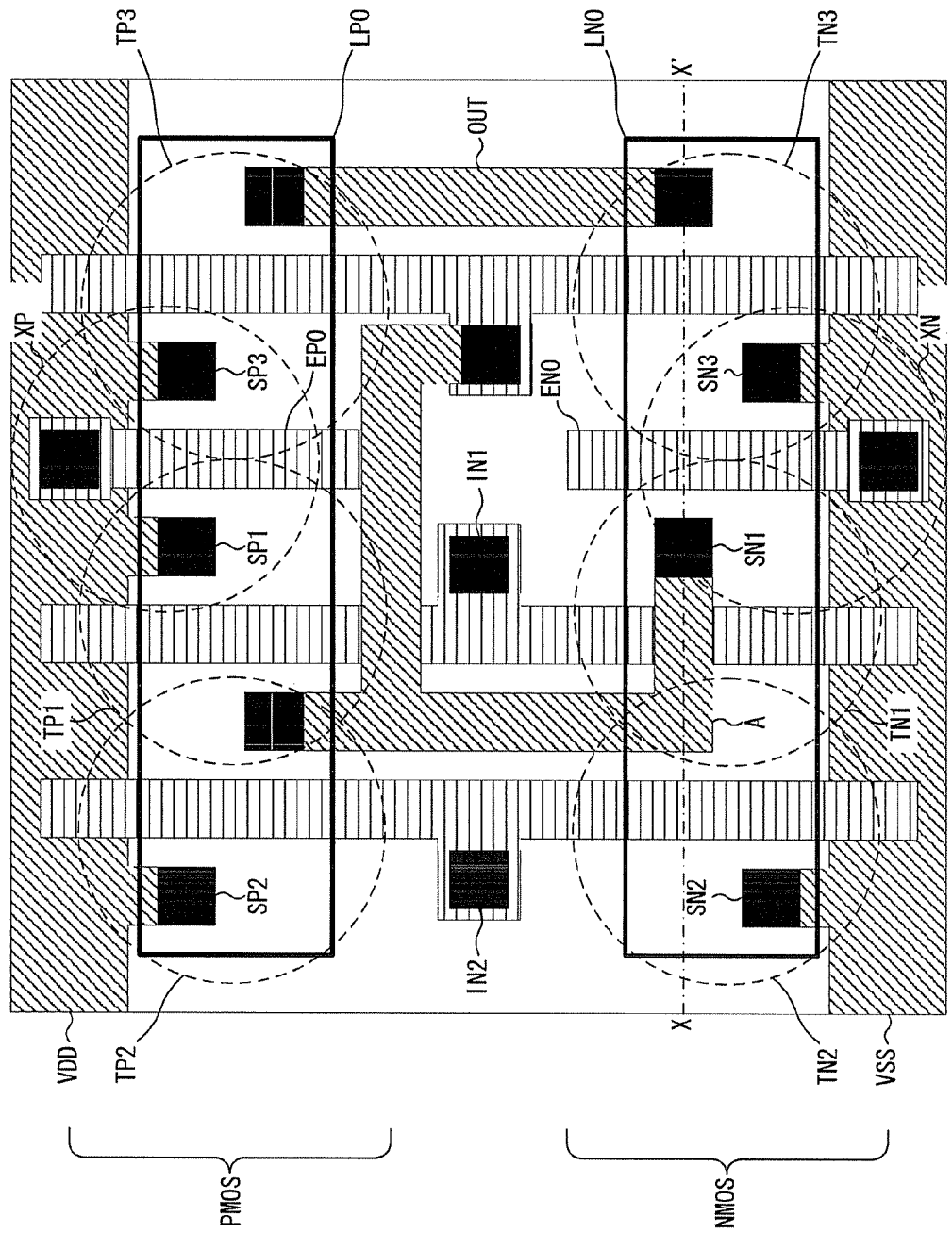
FIG. 5 is a plan view illustrating a layout example of the first circuit according to Comparative Example 2.
Figure 6:
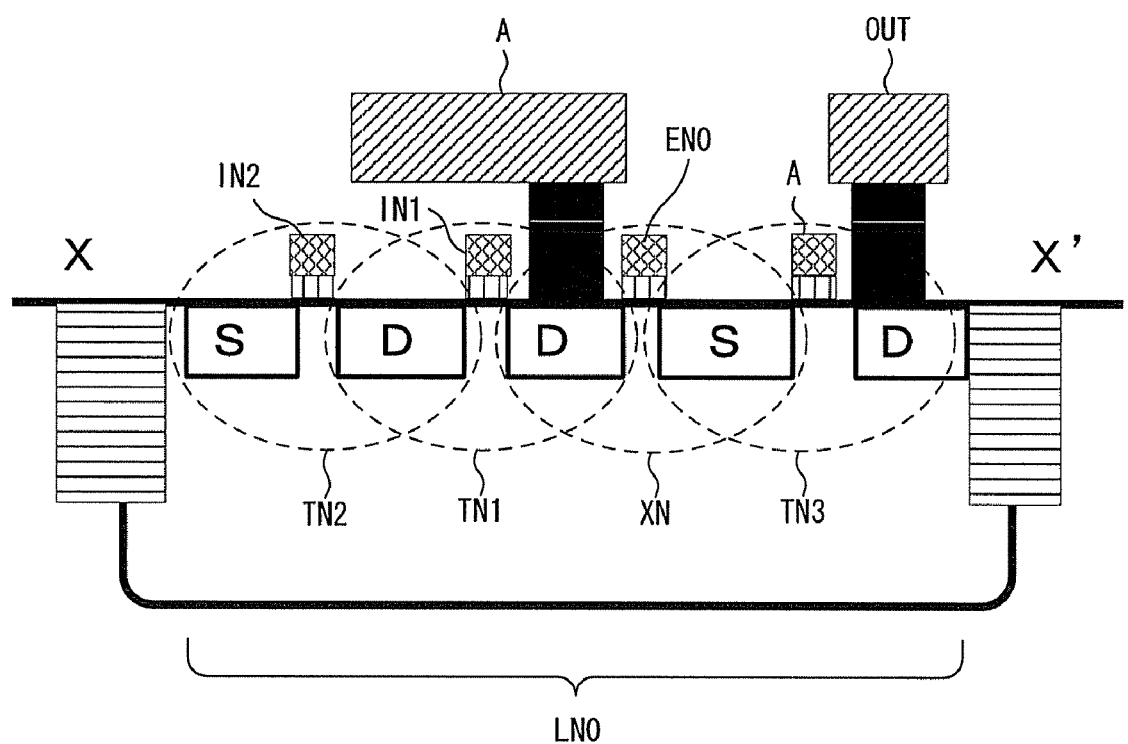
FIG. 6 is a cross-sectional view illustrating a layout example of the first circuit according to Comparative Example 2.

Comparative Example 2 is a case where a dummy transistor is used for device isolation in place of the STI. FIG. 5 is a plan view illustrating a layout example of the first circuit according to Comparative Example 2. In FIG. 5, the same reference marks as those in FIG. 3 denote the same or corresponding parts as those in FIG. 3, and the descriptions thereof will be omitted here. FIG. 6 is a cross-sectional view illustrating a layout example of the first circuit according to Comparative Example 2. In FIG. 6, the same reference marks as those in FIG. 5 denote the same or corresponding parts as those in FIG. 5, and the descriptions thereof will be omitted here. FIG. 6 is a cross-sectional view taken along X-X' line of FIG. 5.

In Comparative Example 2, the PMOS transistors TP1 and TP3 are isolated from each other by a dummy transistor XP, and the NMOS transistors TN1 and TN3 are isolated from each other by a dummy transistor XN. A gate electrode EP0 of the dummy transistor XP is provided between the source electrodes SP1 and SP3, and a gate electrode EN0 is provided as an enable terminal of the dummy transistor XN between the source electrodes SN1 and SN3. As a result, all the PMOS transistors TP1, TP2, XP, and TP3 are formed on one continuous diffusion layer LP0, and all the NMOS transistors TN1, TN2, XN, and TN3 are formed on one continuous diffusion layer LN0.

When the gate electrode EP0 is connected to the VDD, the dummy transistor XP is kept in an OFF state. Further, when the gate electrode EN0 serving as the enable terminal is connected to the VSS, the dummy transistor XN is kept in an OFF state.

According to Comparative Example 2, the problem of Comparative Example 1 can be solved. However, since only transistors having the same characteristics can be constructed in one diffusion layer, the performance of the transistor is constrained.

First Embodiment

In the present embodiment, a semiconductor device in which two dummy transistors are provided between two devices and thereby different channel widths W can be set for the two devices will be described.

Figure 7:
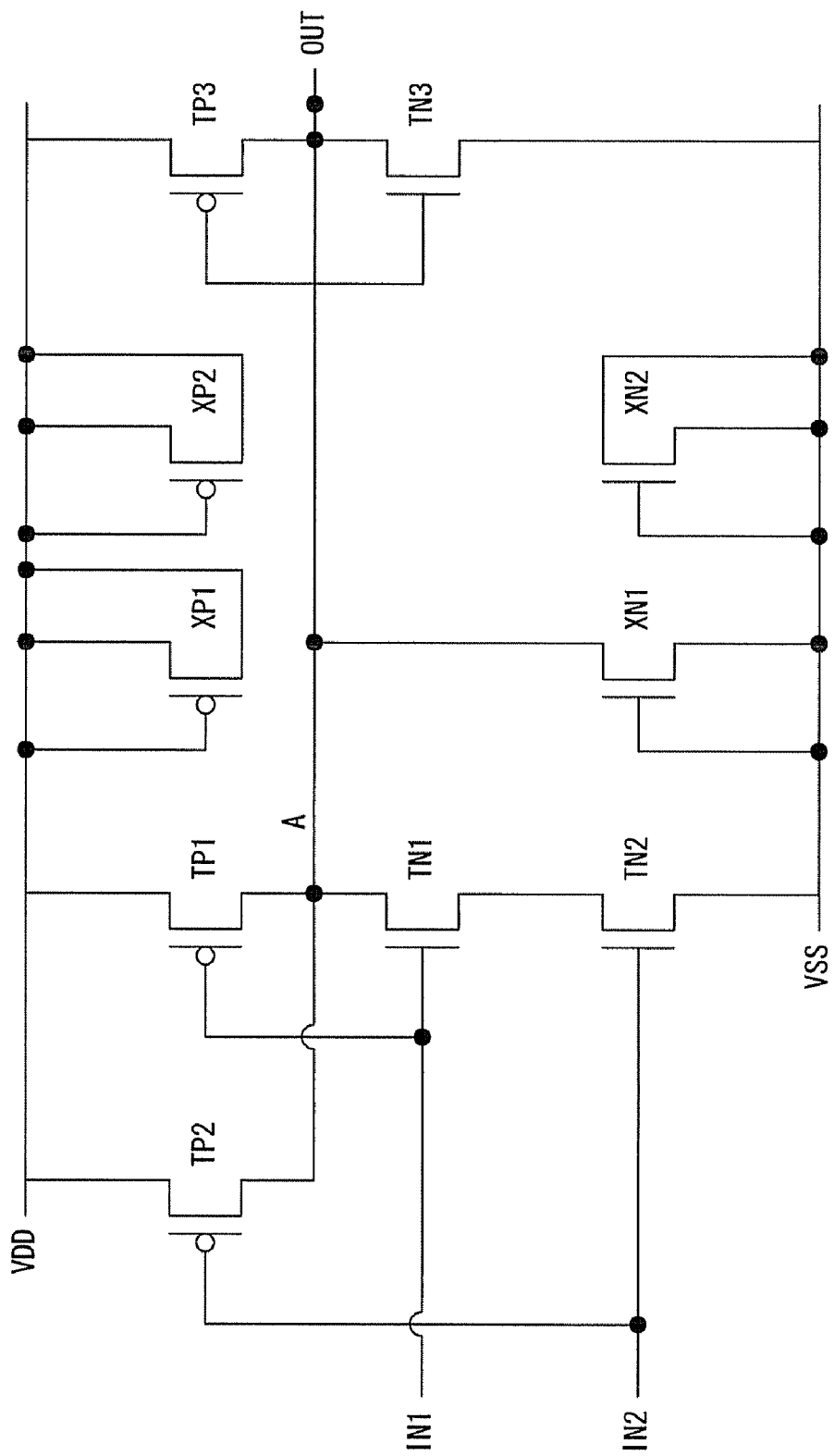
FIG. 7 is a circuit diagram illustrating the details of a configuration of the first circuit according to a first embodiment.

FIG. 7 is a circuit diagram illustrating the details of a configuration of the first circuit according to the first embodiment. In FIG. 7, the same reference marks as those in FIG. 2 denote the same or corresponding parts as those in FIG. 2, and the descriptions thereof will be omitted here. The circuit of FIG. 7 is obtained by adding the dummy PMOS transistors XP1 and XP2 and dummy NMOS transistors XN1 and XN2 to the circuit of FIG. 2.

Figure 8:
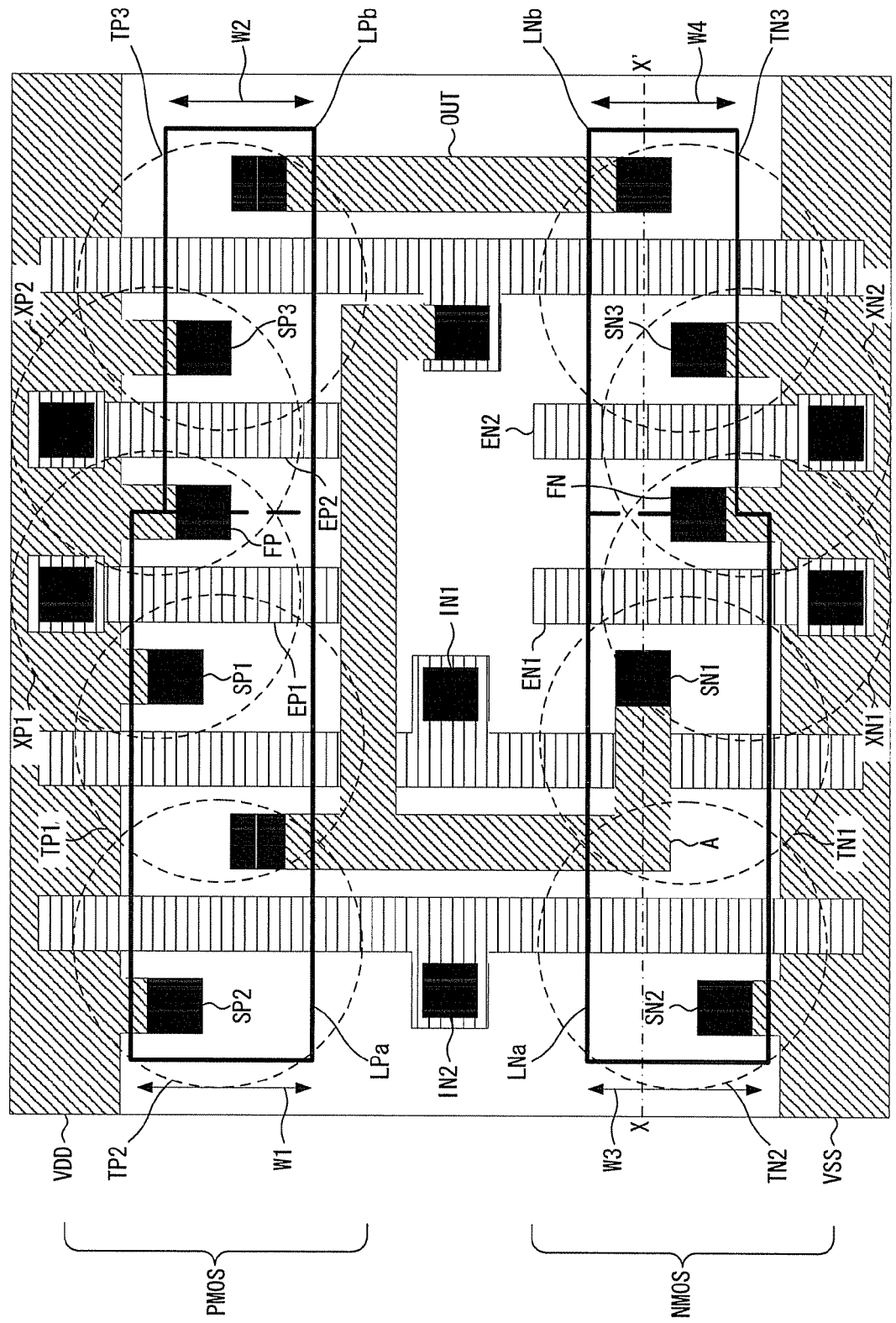
FIG. 8 is a plan view illustrating a layout example of the first circuit according to the first embodiment.
Figure 9:
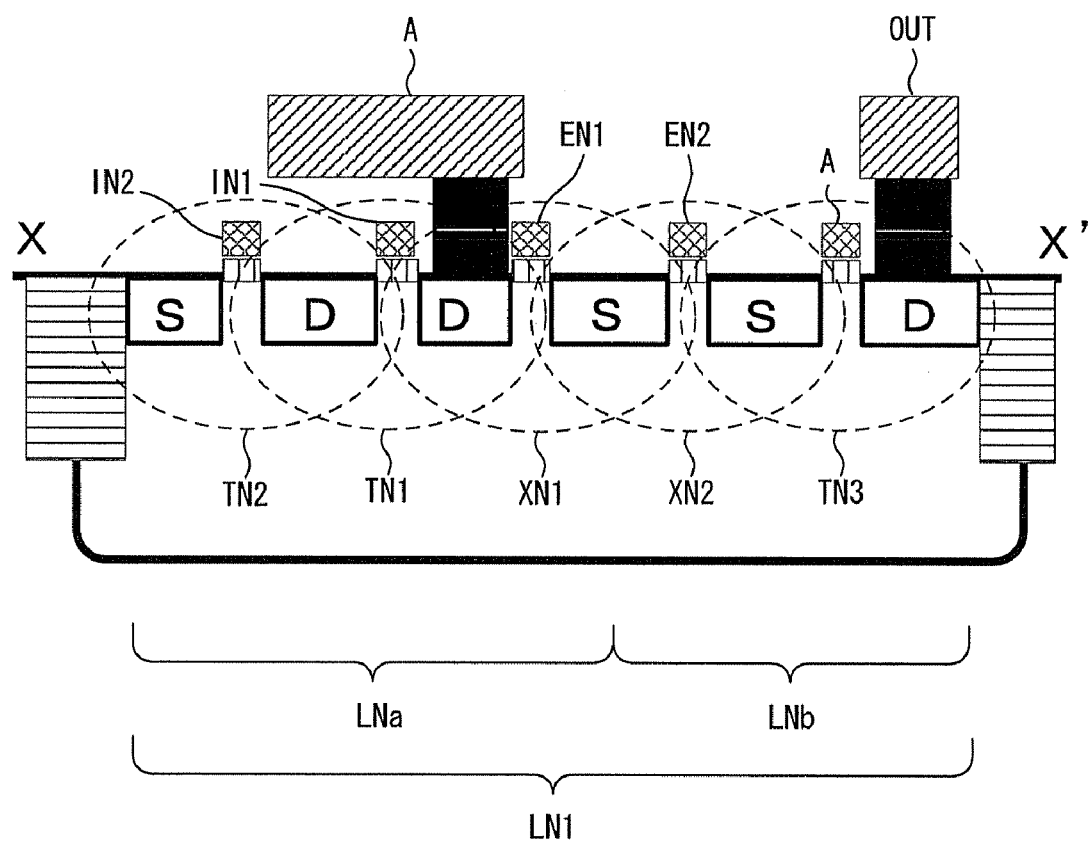
FIG. 9 is a cross-sectional view illustrating a layout example of the first circuit according to the first embodiment.

FIG. 8 is a plan view illustrating a layout example of the first circuit according to the first embodiment. In FIG. 8, the same reference marks as those in FIG. 5 denote the same or corresponding parts as those in FIG. 5, and the descriptions thereof will be omitted here. Further, FIG. 8 illustrates the layout of the circuit of FIG. 7. FIG. 9 is a cross-sectional view illustrating a layout example of the first circuit according to the first embodiment. In FIG. 9, the same reference marks as those in FIG. 8 denote the same or corresponding parts as those in FIG. 8, and the descriptions thereof will be omitted here. FIG. 9 is a cross-sectional view taken along X-X' line of FIG. 8.

In the present embodiment, PMOS transistors TP1 (first transistor) and TP3 (second transistor) are isolated from each other by dummy transistors XP1 (third transistor) and XP2 (fourth transistor), and NMOS transistors TN1 (first transistor) and TN3 (second transistor) are isolated from each other by dummy transistors XN1 (third transistor) and XN2 (fourth transistor).

A gate electrode EP1 of the dummy transistor XP1 is provided between the source electrodes SP1 and SP3, a gate electrode EP2 of the dummy transistor XP2 is provided between the gate electrode EP1 and source electrode SP3, and a drain electrode FP of the dummy transistors XP1 and XP2 is provided between the gate electrodes EP1 and EP2. Similarly, a gate electrode EN1 is provided as an enable terminal of the dummy transistor XN1 between the source electrodes SN1 and SN3, a gate electrode EN2 is provided as an enable terminal of the dummy transistor XN2 between the gate electrode EN1 and source electrode SN3, and a drain electrode FN of the dummy transistors XN1 and XN2 is provided between the gate electrodes EN1 and EN2. Although there are provided in this example the drain electrode FP which is connected to the VDD so as to make the potentials of the drains of the dummy transistors XP1 and XP2 constant and the drain electrode FN which is connected to the VSS so as to make the potentials of the drains of the dummy transistors XN1 and XN2 constant, the drain electrodes FP and FN need not always be provided.

Thus, all the PMOS transistors TP1, TP2, XP1, XP2, and TP3 are formed on one continuous diffusion layer LP1, and all the NMOS transistors TN1, TN2, XN1, XN2, and TN3 are formed on one continuous diffusion layer LN1.

When the gate electrodes EP1 and EP2 are connected to the VDD, the dummy transistors XP1 and XP2 are kept in an OFF state. Similarly, when the gate electrodes EN1 and EN2 serving as the enable terminals are connected to the VSS, the dummy transistors XN1 and XN2 are kept in an OFF state. That is, existence of the dummy transistors XP1, XP2, XN1, and XN2 does not affect the function of the first circuit.

In the present embodiment, the channel width W of the diffusion layer LP1 is changed between the dummy transistors XP1 and XP2. That is, in the diffusion layer LP1, the channel width W of a region LPa (first diffusion region) where the transistors TP1, TP2, and XP1 are formed is set to W1, and the channel width W of a region LPb (second diffusion region) where the transistors XP2 and TP3 are formed is set to W2. Similarly, the channel width W of the diffusion layer LN1 is changed between the XN1 and XN2. That is, in the diffusion layer LN1, the channel width W of a region LNa (first diffusion region) where the transistors TN1, TN2, and XN1 are formed is set to W3, and the channel width W of a region LNb (second diffusion region) where the transistors XN2 and TN3 are formed is set to W4.

By providing the two dummy transistors in one diffusion layer, it is possible to define the boundary of the channel width between the two dummy transistors. Therefore, a fixed channel width can be set for the left side region of the one diffusion layer LP1 starting from the dummy transistor XP1 and extending to the left and another fixed channel width can be set for the right side region of the one diffusion layer LP1 starting from the dummy transistor XP2 and extending to the right. Similarly, a fixed channel width can be set for the left side region of the one diffusion layer LN1 starting from the dummy transistor XN1 and extending to the left and another fixed channel width can be set for the right side region of the one diffusion layer LN1 starting from the dummy transistor XN2 and extending to the right.

According to the present embodiment, by forming the diffusion layer in a continuous manner across a plurality of circuits, it is possible to eliminate the need to provide the STI which may cause the deterioration of the transistor performance and to enhance the effect of the strained silicon. Further, by providing the two dummy transistors between two devices, it is possible to set different channel widths W for the two devices. Thus, the value of the channel width can be made different region by region in one continuous diffusion layer, allowing design of a transistor having appropriate channel widths for respective circuits. That is, even in the case where there occurs a need to change the value of the channel width in order to optimize transistor characteristics for each region in the continuous diffusion layer, a transistor having optimum channel width can be obtained by forming the dummy transistors in the region at which the channel width is changed.

Second Embodiment

In the present embodiment, a semiconductor device in which two dummy transistors are provided between two devices and thereby different threshold voltages Vth can be set for the two devices will be described.

Figure 10:
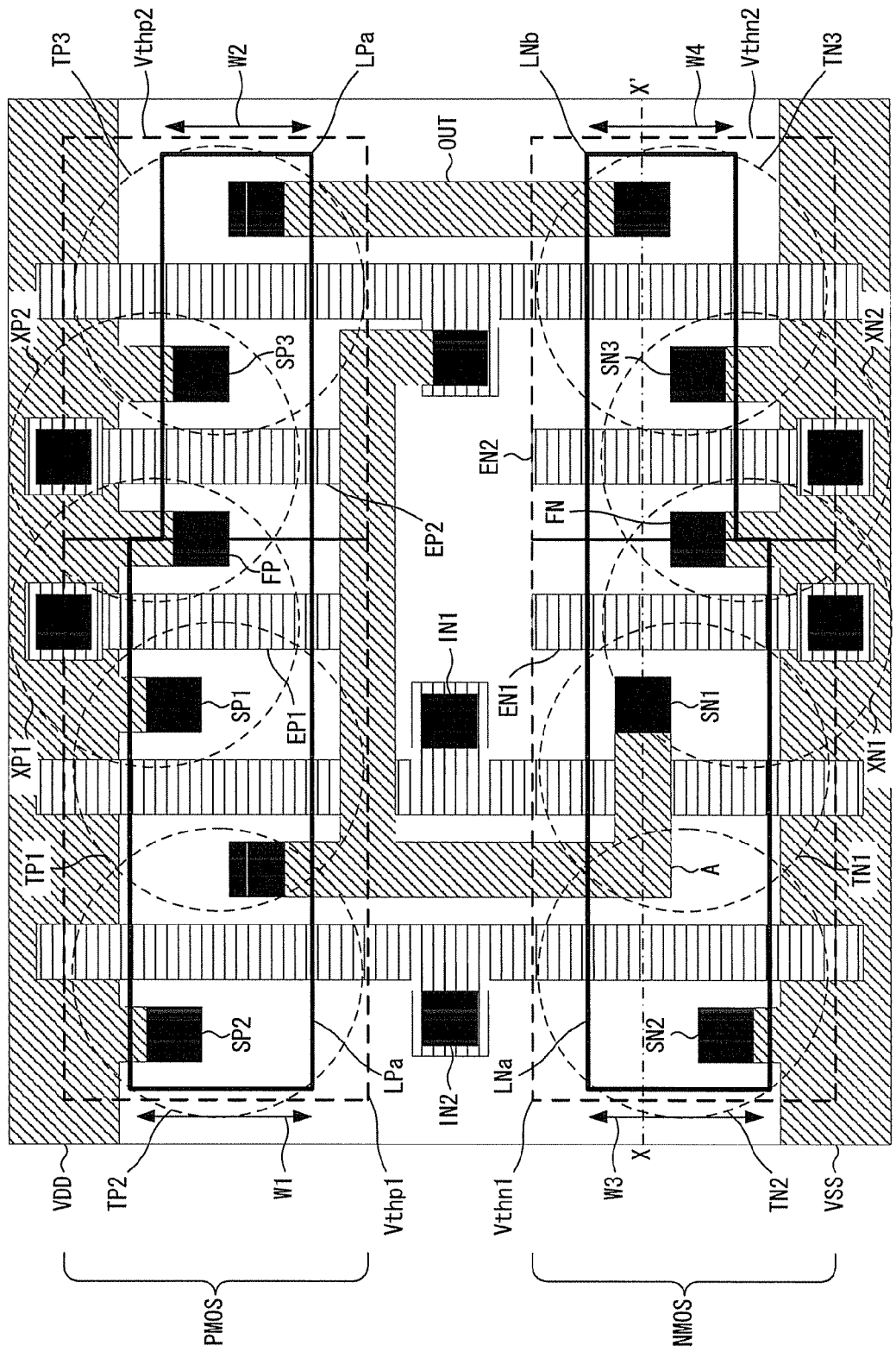
FIG. 10 is a plan view illustrating a layout example of the first circuit according to a second embodiment.
Figure 11:
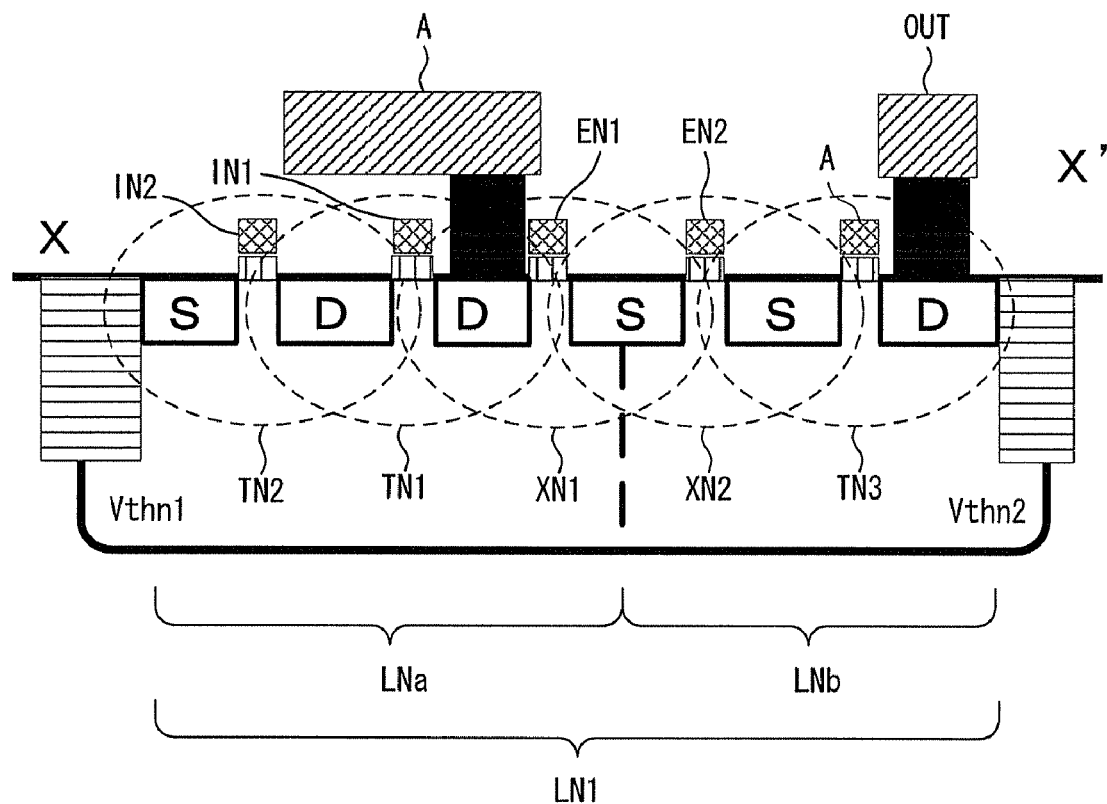
FIG. 11 is a cross-sectional view illustrating a layout example of the first circuit according to the second embodiment.

FIG. 10 is a plan view illustrating a layout example of the first circuit according to the second embodiment. In FIG. 10, the same reference marks as those in FIG. 8 denote the same or corresponding parts as those in FIG. 8, and the descriptions thereof will be omitted here. As with FIG. 8, FIG. 10 illustrates the layout of the circuit of FIG. 7. FIG. 11 is a cross-sectional view illustrating a layout example of the first circuit according to the second embodiment. In FIG. 11, the same reference marks as those in FIG. 10 denote the same or corresponding parts as those in FIG. 10, and the descriptions thereof will be omitted here. FIG. 11 is a cross-sectional view taken along X-X' line of FIG. 10.

As in the case of the first embodiment, all the PMOS transistors TP1, TP2, XP1, XP2, and TP3 are formed on one continuous diffusion layer LP1, and all the NMOS transistors TN1, TN2, XN1, XN2, and TN3 are formed on one continuous diffusion layer LN1.

In the present embodiment, the dose amount of a region (first diffusion region) where the transistors TP1, TP2, and XP1 are formed and does amount of a region (second diffusion region) where the transistors XP2 and TP3 are formed are made different to thereby set the value of the threshold voltage Vth of the PMOS transistors TP1 and TP2 to Vthp1 and the value of the threshold voltage Vth of the PMOS transistors TP3 to Vthp2. The dose amount denotes an electron or ion injection amount per unit area of the silicon substrate. Similarly, the dose amount of a region (first diffusion region) where the NMOS transistors TN1, TN2, and XN1 are formed and does amount of a region (second diffusion region) where the transistors XN2 and TN3 are formed are made different to thereby set the value of the threshold voltage of the transistors TN1 and TN2 to Vthn1 and the value of the threshold voltage of the transistors TN3 to Vthn2.

For example, an ion injection mask for normal threshold voltage is used to conduct ion injection to the region where the transistors XP2 and TP3 are formed and region where the transistors XN2 and TN3 are formed, while an ion injection mask for high threshold voltage is used to conduct ion injection to the region where the transistors TP1, TP2, and XP1 are formed and region where the transistors TN1, TN2, and XN1 are formed. As a result, the threshold voltages Vthp1 and Vthn1 of the transistors TP1, TP2, TN1, and TN2 can be made higher than the threshold voltages Vthp2 and Vthn2 of the transistors TP3 and TN3.

Further, as in the case of the first embodiment, in the diffusion layer LP1, the channel width W of the region where the transistors TP1, TP2, and XP1 are formed is set to W1, and the channel width W of the region where the transistors XP2 and TP3 are formed is set to W2. Similarly, in the diffusion layer LN1, the channel width W of the region where the transistors TN1, TN2, and XN1 are formed is set to W3, and the channel width W of the region where the transistors XN2 and TN3 are formed is set to W4.

By providing the two dummy transistors in one diffusion layer LP1, it is possible to define the boundary of the threshold voltage between the two dummy transistors. Therefore, a fixed threshold voltage can be set for the left side region of the one diffusion layer LP1 starting from the dummy transistor XP1 and extending to the left and another fixed threshold voltage can be set for the right side region of the one diffusion layer LP1 starting from the dummy transistor XP2 and extending to the right. Similarly, a fixed threshold voltage can be set for the left side region of the one diffusion layer LN1 starting from the dummy transistor XN1 and extending to the left and another threshold voltage width can be set for the right side region of the one diffusion layer LN1 starting from the dummy transistor XN2 and extending to the right.

According to the present embodiment, by forming the diffusion layer in a continuous manner across a plurality of circuits, it is possible to eliminate the need to provide the STI which may cause the deterioration of the transistor performance and to enhance the effect of the strained silicon. Further, the value of the threshold voltage can be made different region by region in one continuous diffusion layer, allowing design of a transistor having appropriate threshold voltage values for respective circuits.

Although both the channel width and threshold voltage are made different between the regions which are isolated from each other by the dummy transistors in the present embodiment, only the threshold voltage may be made different between the regions.

Third Embodiment

In the present embodiment, a semiconductor device in which two dummy transistors are provided between two devices and thereby stable power supply to the two devices can be achieved will be described.

First, a second circuit exemplified as a circuit will be described. The second circuit has a first 2-NAND (2-input negative logical multiplication) circuit and a second 2-NAND circuit.

Figure 12:
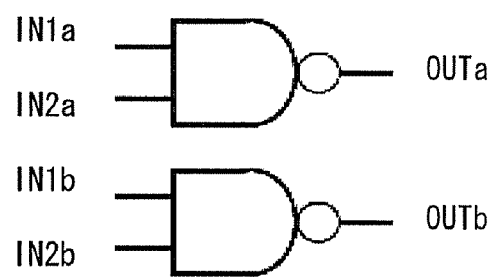
FIG. 12 is a circuit diagram illustrating the outline of a configuration of a second circuit.
Figure 13:
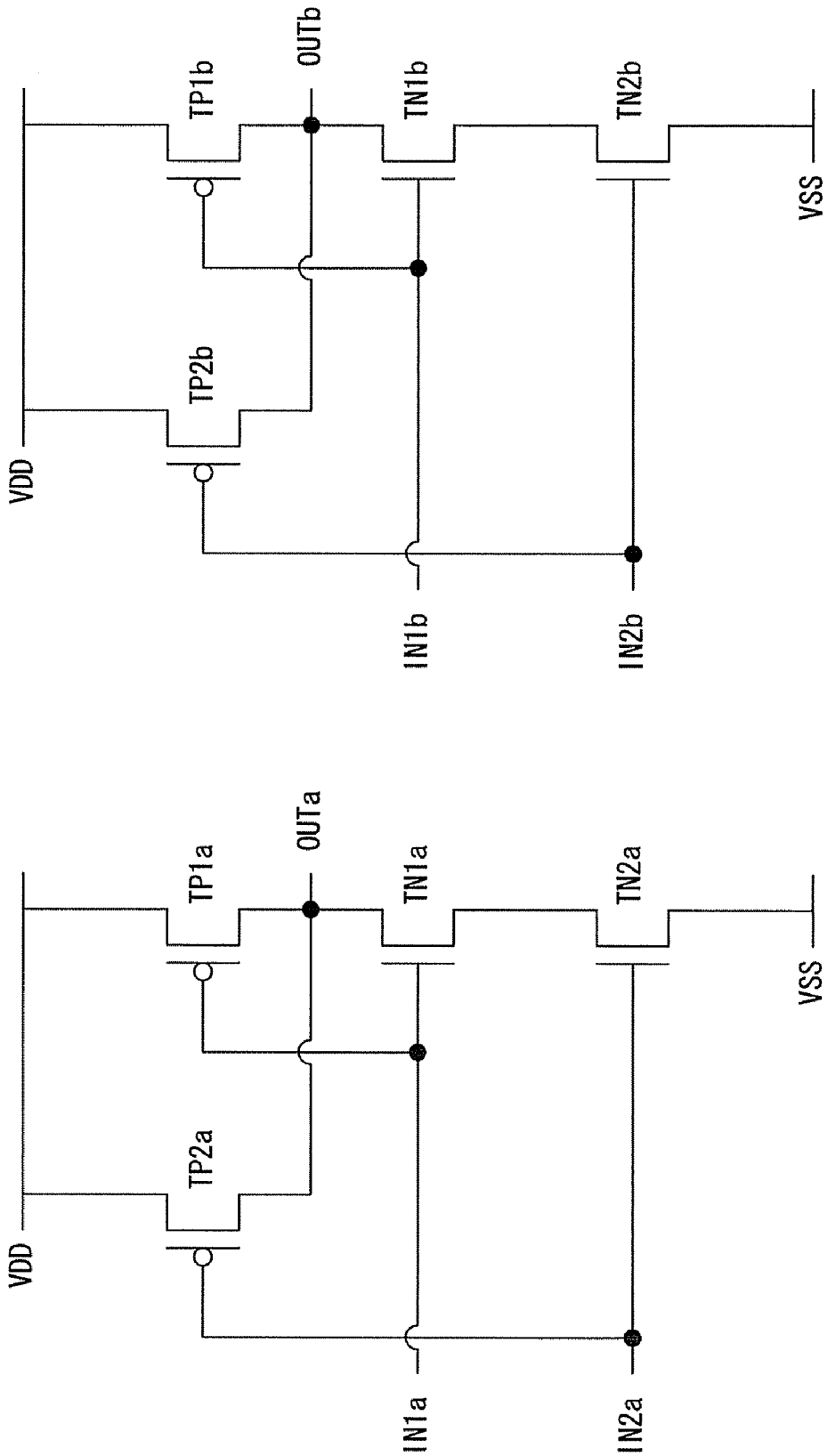
FIG. 13 is a circuit diagram illustrating the details of the configuration of the second circuit.

FIG. 12 is a circuit diagram illustrating the outline of a configuration of the second circuit. The first 2-NAND circuit receives as inputs IN1a and IN2a and outputs OUTa. The second 2-NAND circuit receives as inputs IN1b and IN2b and outputs OUTb. FIG. 13 is a circuit diagram illustrating the details of the configuration of the second circuit. The first 2-NAND circuit is constituted by PMOS transistors TP1a, TP2a and NMOS transistors TN1a, TN2a. The second 2-NAND circuit is constituted by PMOS transistors TP1b, TP2b and NMOS transistors TN1b, TN2b.

Figure 14:
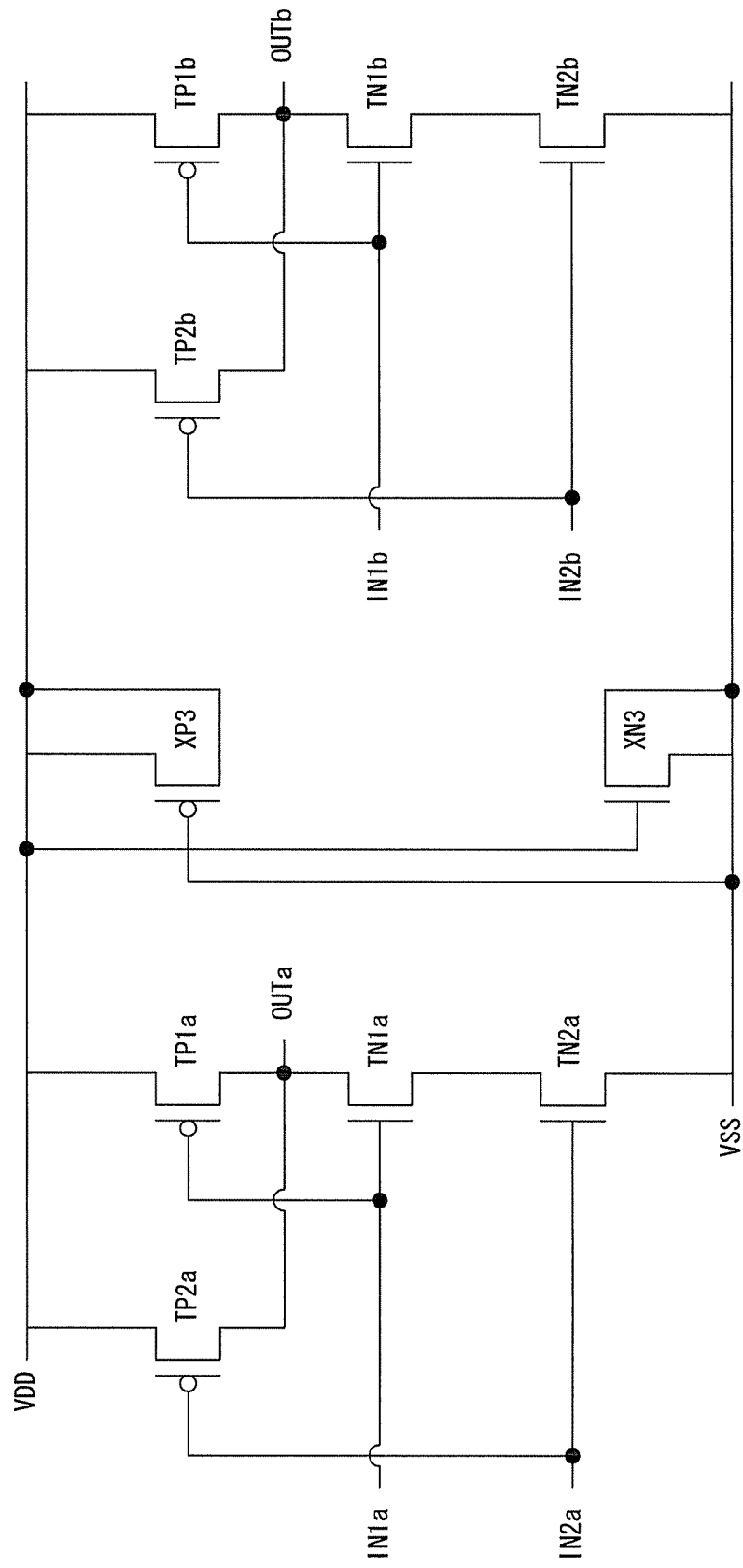
FIG. 14 is a circuit diagram illustrating the details of a configuration of the second circuit according to a third embodiment.

FIG. 14 is a circuit diagram illustrating the details of a configuration of the second circuit according to the third embodiment. In FIG. 14, the same reference marks as those in FIG. 13 denote the same or corresponding parts as those in FIG. 13, and the descriptions thereof will be omitted here. The circuit of FIG. 14 is obtained by adding the dummy PMOS transistors XP3 and dummy NMOS transistor XN3 to the circuit of FIG. 13.

Figure 15:
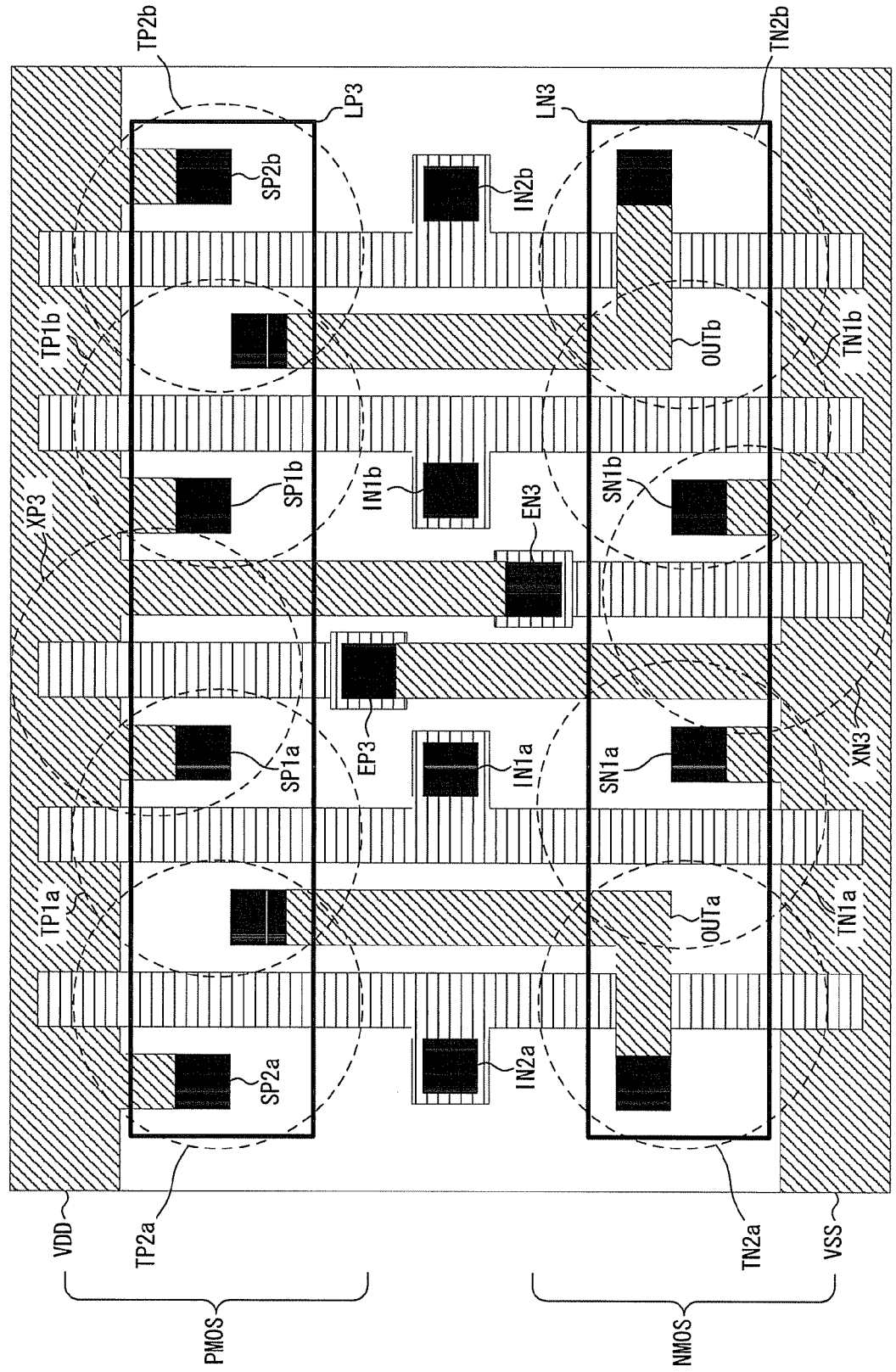
FIG. 15 is a plan view illustrating a layout example of the second circuit according to the third embodiment.

FIG. 15 is a plan view illustrating a layout example of the second circuit according to the third embodiment. FIG. 15 illustrates the layout of the circuit of FIG. 14. As in the case of the first embodiment, a power supply wiring VDD (high potential) is disposed at the uppermost portion in FIG. 15, and a power supply wiring VSS (low potential) is disposed at the lowermost portion. The PMOS transistors are arranged on the VDD side, and the NMOS transistors are arranged on the VSS side. As the PMOS transistors, the transistors TP2a, TP1a, XP3, TP1b, and TP2b are arranged in this order from the left. As the NMOS transistors, the transistors TN2a, TN1a, XN3, TN1b, and TN2b are arranged in this order from the left.

In the present embodiment, PMOS transistors TP1a (fifth transistor) and TP1b (sixth transistor) are isolated from each other by dummy transistors XP3 (seventh transistor), and NMOS transistors TN1a (fifth transistor) and TN1b (sixth transistor) are isolated from each other by dummy transistors XN3 (seventh transistor).

IN1a is a gate electrode of the transistors TP1a and TN1a, and IN2a is a gate electrode of the TP2a and TN2a. IN % is a gate electrode of the TP1b and TN1b, and IN2b is a gate electrode of the TP2b and TN2b. OUTa is a drain electrode of the TP1a, TP2a, and TN2a. OUTb is a drain electrode of the TP1b, TP2b, and TN2b. SP1a is a source electrode of the TP1a, and SN1a is a source electrode of the TN1a. SP2a is a source electrode of the TP2a. SP1b is a source electrode of the TP1b, and SN1b is a source electrode of the TN1b, and SP2b is a source electrode of the TP2b.

In the present embodiment, the TP1a and TP1b are isolated from each other by a dummy transistor XP3 and the TN1a and TN1b are isolated from each other by a dummy transistor XN3. A gate electrode EP3 of the XP3 is provided between the SP1a and SP1b, and a gate electrode EN3 is provided as an enable terminal of the XN3 between the SN1a and SN1b. As a result, all the PMOS transistors TP2a, TP1a, XP3, TP1b, and TP2b are formed on one continuous diffusion layer LP3 (diffusion region), and all the NMOS transistors TN2a, TN1a, XN3, TN1b, and TN2b are formed on one continuous diffusion layer LN3 (diffusion region).

When the gate electrode EP3 is connected to the VSS, the dummy transistor XP3 is kept in an ON state. Further, the gate electrode EN3 is connected to the VDD, the dummy transistor XN3 is kept in an ON state. That is, existence of the dummy transistors XP3 and XN3 does not affect the function of the second circuit.

In the case where the source electrodes SP1a and SP1b connected to the power supply wiring are disposed close to each other, the dummy transistor XP3 is provided between the source electrodes SP1a and SP1b, thereby reducing power supply noise in the power supply wiring VDD by an electrostatic capacitance of the dummy transistor XP3 connecting the power supply wirings. Similarly, in the case where the source electrodes SP1a and SP1b connected to the power supply wiring are disposed close to each other, the dummy transistor XN3 is provided between the source electrodes SN1a and SN1b, thereby reducing power supply noise in the power supply wiring VDD by an electrostatic capacitance of the dummy transistor XN3 connecting the power supply wirings.

According to the present embodiment, by forming the diffusion layer in a continuous manner across a plurality of circuits, it is possible to eliminate the need to provide the STI which may cause the deterioration of the transistor performance and to enhance the effect of the strained silicon. Further, by providing the dummy transistors, it is possible to reduce the power supply noise to thereby make the circuit operation stable.

According to the embodiments of the present invention, it is possible to improve the performance of a circuit in the case where a plurality of circuits are arranged in a continuous diffusion layer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor device in a continuous diffusion region formed on a semiconductor substrate and having either a P-type or N-type polarity, the device comprising:
    a first transistor formed within the continuous diffusion region;
    a second transistor formed within the continuous diffusion region and in an area that is different from an area where the first transistor is formed;
    a third transistor formed within the continuous diffusion region and in an area between the first and second transistors, the third transistor having a gate electrode to which a fixed potential is applied; and
    a fourth transistor formed within the continuous diffusion region and in an area between the second and third transistors, the fourth transistor having a gate electrode to which the fixed potential is applied,
    wherein the third and fourth transistors are kept in an OFF state.

2. The semiconductor device according to claim 1, comprising:
    two sets of the first, second, third, and fourth transistors, wherein
    in one of the two sets, the first, second, third, and fourth transistors are PMOS transistors, and
    in other one of the two sets, the first, second, third, and fourth transistors are NMOS transistors.

3. The semiconductor device according to claim 1, wherein the gate electrodes of the third and fourth transistors are connected to a power supply.

4. The semiconductor device according to claim 3, wherein the gate electrodes of the third and fourth transistors are connected to the power supply connected to the first and second transistors.

5. The semiconductor device according to claim 1, further comprising, between the gate electrodes of the third and fourth transistors, an electrode connected to a power supply.

6. The semiconductor device according to claim 5, wherein the electrode connected to the power supply is a drain electrode of the third and fourth transistors.

7. The semiconductor device according to claim 1, further comprising:
    a fifth transistor formed within the continuous diffusion region;
    a sixth transistor formed within a second continuous diffusion region, and having a threshold voltage that is different from what a fifth transistor has;
    a seventh transistor formed within the continuous diffusion region and in an area between the fifth and sixth transistors, having the same threshold voltage that a fifth transistor has, and having a gate electrode to which a fixed potential is applied; and
    an eighth transistor formed within the second continuous diffusion region and in an area between the sixth and seventh transistors, having the same threshold voltage that the sixth transistor has, and having a gate electrode to which a fixed potential is applied,
    wherein a dose amount of the continuous diffusion region is different than a dose amount of the second continuous diffusion region.

8. The semiconductor device according to claim 7, comprising:
    two sets of the fifth, sixth, seventh and eighth transistors, wherein
    in one of the two sets, the fifth, sixth, seventh and eighth transistors are PMOS transistors, and
    in other one of the two sets, the fifth, sixth, seventh and eighth transistors are NMOS transistors.

9. The semiconductor device according to claim 7, wherein the gate electrode of the seventh and eighth transistors are connected to a power supply.

10. The semiconductor device according to claim 9, wherein
    an electrode of the fifth transistor and an electrode of the sixth transistor are connected to a power supply, the gate electrode of the seventh transistor adjoins the electrode of the fifth transistor, and the gate electrode of the eighth transistor adjoins the electrode of the sixth transistor.

11. The semiconductor device according to claim 9, wherein
    the gate electrode of the seventh and eighth transistors are connected to the power supply different from a power supply connected to the fifth and sixth transistors.

* * * * *